US006312487B1

(12) United States Patent
Tanaka

(10) Patent No.: US 6,312,487 B1
(45) Date of Patent: Nov. 6, 2001

(54) POLISHING COMPOUND AND AN EDGE POLISHING METHOD THEREBY

(75) Inventor: Hiroaki Tanaka, Narashino (JP)

(73) Assignee: Speedfam Co Ltd, Kanagawa-pref (TW)

( * ) Notice: Subject to any disclaimer, the term of this patent is extended or adjusted under 35 U.S.C. 154(b) by 0 days.

(21) Appl. No.: 09/305,482

(22) Filed: May 6, 1999

(30) Foreign Application Priority Data

May 7, 1998 (JP) .................................................. 10-125071

(51) Int. Cl.[7] ................................ B24B 1/00; C09K 3/14; C09G 1/02
(52) U.S. Cl. .................................. 51/309; 51/308; 106/3; 438/692; 438/693; 451/36; 451/37; 252/79.2; 252/79.4; 437/225
(58) Field of Search .......................... 51/308, 309; 106/3; 438/692, 693; 437/225, 231, 947; 510/175, 395, 397; 451/36, 37; 252/79.2, 79.4

(56) References Cited

U.S. PATENT DOCUMENTS

| | | | |
|---|---|---|---|
| 3,715,842 | * 2/1973 | Tredinnick et al. | 51/308 |
| 5,128,281 | * 7/1992 | Dyer et al. | 437/225 |
| 5,228,886 | * 7/1993 | Zipperian | 51/309 |
| 5,264,010 | * 11/1993 | Brancaleoni et al. | 51/309 |
| 5,693,239 | * 12/1997 | Wang et al. | 51/309 |
| 5,733,819 | * 3/1998 | Kodama et al. | 106/3 |
| 5,891,205 | * 4/1999 | Picardi et al. | 51/309 |
| 5,997,620 | * 12/1999 | Kodama et al. | 51/308 |
| 6,027,669 | * 2/2000 | Miura et al. | 106/3 |
| 6,099,604 | 8/2000 | Sandhu et al. . | |
| 6,174,454 | * 1/2001 | Tsai et al. | 252/79.4 |
| 6,190,237 | * 2/2001 | Huynh et al. | 451/41 |

* cited by examiner

Primary Examiner—Michael Marcheschi

(57) ABSTRACT

A polishing compound in the form of a dispersion containing silicon oxide particles having an average diameter of 8 to 500 manometers and at least one kind of metal compound particles having an average diameter of 10 to 3000 nanometers and selected from metal oxides, metal nitrides and metal carbides. The concentration of silicon oxide particles is 1 to 15 wt. %. The concentration of silicon oxide particles is 0.1 to 10 wt. %. The pH of the dispersion is 8.3 to 11.5, and is buffered by the addition of a buffering combination composed of weak acid and/or weak base, wherein the logarithms of reciprocal number of acid dissociation constant at 25° C. of the weak acid and/or weak base is 8.0 to 12.5.

15 Claims, No Drawings

POLISHING COMPOUND AND AN EDGE POLISHING METHOD THEREBY

FIELD OF THE INVENTION

This invention relates to a polishing compound useful for edge polishing of a semiconductor substrate composed of a silicon wafer or a wafer of compound semiconductor whose surface is covered by thin layer of silicon oxide or silicon nitride, a method for preparation of the polishing compound and a polishing method using the polishing compound. More specifically, this invention relates to such polishing compound having buffer action and large electrical conductivity.

DESCRIPTION OF THE PRIOR ART

Electric parts such as IC, LSI, or VLSI, which are made from semiconductor materials e.g. silicon mono crystalline, are produced as follows. That is, an ingot of silicon mono crystalline compound semiconductor is sliced to a thin wafer, precise electrical circuit pattern is formed on the surface of the sliced wafer and divided into chips. Then, IC, LSI, or VLSI are prepared based on the chip. The as cut wafer which is prepared by slicing an ingot is lapped, etched and polished to a mirror finish and at least one side of the wafer is mirror finished. On the mirror finished surface, fine and precise electrical pattern is formed at the device procedure. The wafer is processed while maintaining the original disk shape until it is divided to unit semiconductor chips. Between above mentioned main procedures, there are washing, drying and transporting procedures. If the outermost periphery of the wafer has steep and sharp edge and coarser surface roughness during above mentioned series of procedures, the sharp edge contacts with an apparatus or other substance and very fine particles are generated by very small breaking. Further, very fine contamination particles are caught in the coarse surface of the edge, and the caught fine contamination particles are released at the latter procedure and cause a contamination problem of the precision finished surface, thereby deteriorating the yield of products and the surface quality. Usually, to prevent the above mentioned problem, the outermost periphery edge of the wafer is chamfered (beveling) and mirror finished (edge polishing) at the early stage of the wafer processing.

In general, the above mentioned edge polishing is carried out by the following method. Namely, on the surface of a rotatable drum of an edge polishing machine a polishing pad such as resin foam, synthetic leather or unwoven clothe are wound and stuck, the edge part of silicon wafer whose edge is chamfered is pressed to the rotating drum with necessary angle by rotating, with constant supply of aqueous solution of polishing compound composed mainly by colloidal silica. Thus, the polishing of the outermost peripheral edge of wafer is carried out. The polishing compound used here is the same one used for the surface polishing of the wafer.

As the polishing compound, an aqueous dispersion prepared by dispersing fine particles of colloidal silica in an alkaline solution is commonly used. The pre-polishing and polishing process are different from the previous process based on so-called mechanical processing which uses for instance a diamond grinding stone or hard abrasives of aluminum oxide. The feature of the pre-polishing and polishing process is to utilize the chemical effect of alkali to a silicon wafer, concretely utilize a corroding effect of alkali to a silicon wafer. That is, by the corroding effect of alkali, a thin soft corrosion layer is formed on the surface of a silicon wafer. The formed corrosion layer is removed by a mechanical action of fine particles of colloidal silica, thus the polishing progresses. As mentioned above, since the polishing progresses by the chemical action of alkaline component contained in the solution, it is necessary to maintain pH of the solution of polishing compound within a region greater than 7. That is, when pH of the solution becomes closer to 7, which indicates the neutral region, the chemical action becomes weak and the removing rate falls down. Further, when pH of the solution becomes closer to 14, which indicates strong alkali region, the chemical action becomes strong and the removing rate is improved.

Therefore, in this kind of polishing, the chemical and physical features of the solution of polishing compound is very important. That is, the surface of the silicon wafer is corroded by an alkaline component and a thin corrosion layer is formed. The thickness and the hardness of the thin corrosion layer is largely effected by features of the solution of polishing compound. Since the electrochemical features of the solution of polishing compound have strong influence to the thickness and the hardness, it is very important to keep pH of the solution in a stabilized region. If pH of the solution is easily affected by a change of external conditions such as heat, contact with outside air or contamination from outside, thickness of the layer, speed for corroding, consistency of the layer and removing speed of the layer fluctuate delicately, and it is difficult to expect precise and homogeneous polishing results. Further, since the corrosion layer is removed by the mechanical action of the particles of colloidal silicon oxide abrasives contained in polishing compound, it is necessary that these particles have adequate diameter and are not easily broken or do not cohere and form gel. That is, particles of silicon oxide remove the corrosion layer formed by an alkaline component effectively by a mechanical action. Therefore, the polishing compound must not be a compound which gives bad influence to the mirror finished surface after the corrosion layer is removed.

Up to the present, many kinds of compounds have been proposed as a polishing compound of a silicone wafer. For instance, silica sol and silica gel are proposed as a polishing compound in U.S. Pat. No. 3,170,273. Further, the technique for improving the removing speed by adjusting pH of the colloidal solution within the range from 10.5 to 12.5 is disclosed in U.S. Pat. No. 3,328,141. In U.S. Pat. No. 4,169,337, the technique to add amines in a polishing compound is disclosed. In Japanese Patent Application 2-158684, a polishing compound composed by water, colloidal silica, water soluble polymer of higher than 100,000 molecular weight and water soluble salts is disclosed. Further, in Japanese Patent Application 2-158684, a method for polishing by the use of a polishing compound containing 10 to 80 wt. % of piperazine, a kind of water soluble amine, to silica of silica gel or silica sol is disclosed.

In the meanwhile, the technique of semiconductor devices has remarkably progressed, and the wafer to which surface thin layer of oxide film is provided is becoming more popular. For instance, to prevent the contamination from the reverse side, for insulation or to prevent the diffusion of contamination, usually a thin layer of oxide or nitride is prepared on the surface of mirror finished silicon wafer. The hardness of the surface of wafer which is covered by oxide or nitride layer is remarkably harder than that of bare wafer. The oxide or nitride layer is prepared on the surface of wafer whose surface is mirror finished and the edge part of outermost periphery is ground by #1000 beveling grinding stone. Therefore, the surface roughness of the edge part of outermost periphery is coarser compared with the surface of wafer. The oxide or nitride layer of 2000 Å thickness is provided on the coarse edge surface. As mentioned above, the surface of wafer whose surface is covered by oxide or nitride is remarkably harder compared with the surface of bare wafer. And when the surface is polished by alkaline colloidal silica, the polishing speed drops down to 1/3 level and is disadvantageous from the economical view point. Especially, in the case of edge part polishing which has rougher surface, it is necessary to polish the hard layer and silicon simultaneously. As the method to process the hard surface, the method using the polishing compound which contains fine particles of metal oxide, nitride or carbide as abrasive is usually used. However, the polishing ability is largely affected by the change of external conditions and it is difficult to maintain a constant polishing speed. Therefore, this method can not be said to be a sufficient method which improves the polishing speed of the wafer whose surface is covered by oxide or nitride layer.

BRIEF SUMMARY OF THE INVENTION

The inventor of this invention has carried out an intensive study to improve the polishing ability to a hard machinability wafer which is covered by oxide or nitride layer, and has found that the polishing ability can be improved by the use of colloidal silica containing fine particles of silicon oxide to which fine particles of metal compound such as metal oxide, metal nitride or metal carbide is dispersed as a solution of polishing compound. Further, the inventor has found that the improved polishing ability can be maintained and stabilized for long time by providing the dispersion with a buffering action at a specific alkaline region, and thus accomplished the present invention.

Namely, an object of this invention is to provide a polishing compound solution and preparation method of the solution which is suited to the edge polishing of wafer whose surface is covered with a thin layer of oxide or nitride.

Another object of this invention is to provide a method for edge polishing using a buffered polishing compound solution.

The above mentioned objects can be accomplished by a polishing compound comprising a dispersion containing silicon oxide particles having an average diameter of 8 to 500 nanometers and at least one kind of metal compound particles having an average diameter of 10 to 3000 nanometers and selected from metal oxides, metal nitrides and metal carbides, wherein the concentration of silicon oxide particles is 1 to 15 wt. %, concentration of metal compound particles is 0.1 to 10 wt. % and pH value of the dispersion is 8.3 to 11.5. It is desirable that above mentioned polishing compound is prepared as a buffer solution which has buffering action between pH 8.3 to 11.5 by adding a buffering combination selected from weak acid and strong base, strong acid and weak base or weak acid and weak base, wherein logarithms of reciprocal number of acid dissociation constant at 25° C. of the weak acid and/or weak base is 8.0 to 12.5. Further, it is more desirable that the electric conductivity of above mentioned polishing compound is larger than 25 mS/m per 1 wt. % of silicon oxide.

The electric conductivity at 25° C. can be adjusted to the level larger than 25 mS/m per 1 wt. % of silicon oxide by making the concentration of solution higher or by adding salts.

Further, another object of this invention is to provide a highly concentrated polishing compound which can be used to prepare the polishing compound by diluting with water, organic solvent, solution containing salts, solution containing base, buffer solution or the mixture of them. That is, it is possible to prepare the polishing compound by diluting the dispersion containing silicon oxide particles having 8 to 500 nanometer diameter by 15 to 65 wt. % and at least one kind of metal compound particles having 10 to 3000 nanometer average diameter selected from metal oxides, metal nitrides or metal carbides with water, organic solvent, solution containing salts, solution containing base, buffer solution or mixture thereof.

Further, still another object of this invention can be accomplished by following an edge polishing method. Namely, to the surface of rotating drum of edge polishing machine which is covered by polisher, the edge part of a work-piece, such as, silicon wafer, is pressed by rotating with constant supply of the polishing compound and the edge part of the work-piece is polished. The term "polisher" of this invention indicates, for example, the polishing pad used for the surface polishing of silicon wafer and concretely synthetic resin foam, synthetic leather or nonwoven clothe can be mentioned. As the method to press the edge part of work-piece such as silicon wafer, there may be mentioned a method of inclining the work-piece or a method of forming grooves on the surface of the rotating drum and pressing the edge of the work-piece to the groove.

DETAILED DESCRIPTION OF THE INVENTION

The average diameter of silicon oxide fine particles contained in a colloidal solution of this invention is 8 to 500 nanometers, desirably 8 to 200 nanometers. These fine particles of silicon oxide can be flocculated particles. When the average diameter is smaller than 8 nanometers, the colloidal solution tends to flocculate easily and the stability as a polishing compound is deteriorated. When the average diameter is between 200 and 500 nanometers, although the properties as the polishing compound are not affected, the preparation of stabilized compound is difficult and is not profitable from the view point of price. Further, when the average diameter is larger than 500 nanometers, the particle size is beyond the colloid region and is not suited as the polishing compound.

The concentration of silicon oxide fine particles is from 1 to 15 wt. %, and desirably, 1 to 10 wt. %, when it is used at the practical polishing. When the concentration is lower than 1 wt. %, polishing speed becomes very low and can not be practically used. On the contrary, the polishing speed is improved along with the increase of the concentration of silicon oxide and when the concentration reaches to about 15 wt. % level, the polishing speed reaches to the saturated point and does not improved any more beyond this point. Further, when the concentration is high, fine particles of silicon which are generated as the polishing chips and are oxidized and are added to the recycling solution and speeds the rate of gelation. The colloidal solution thus becomes unstable and the recycling use of the polishing compound is remarkably deteriorated. Still further, it is not profitable from the view point of price to include to high a silicon oxide concentration. As the metal compound composed by metal oxide, metal nitride or metal carbide, for example, aluminum oxide (alumina), zirconium oxide (zirconia), cerium oxide (ceria), manganese oxide, boron nitride, silicon nitride and silicon carbide can be mentioned, however, the invention is not limited to these compounds. Further, a complex oxide of aluminum and silicon, a complex oxide of zirconium and silicon (zircon), complex oxide of titanium and silicon or a complex oxide of cerium and aluminum can be used. By the use of fine particles of these metal compounds together with colloidal silica, the machinability of conventional polishing compound containing solely colloidal silica to the hard processing silicon wafer whose surface is covered with oxide layer or nitride layer is remarkably improved and sufficient polishing speed can be obtained. These metal compounds can be flocculated particles, however, the primary average diameter should still be within the region of 10 to 3000 nanometers. When it is smaller than 10 nanometers, the machinability to the oxide layer or nitride layer is not sufficient, and when it is larger than 3000 nanometers it affect the surface roughness of the mirror finished surface of wafer. The desirable region is 20 to 1000 nanometers, and more desirable region is 20 to 400 nanometers. For the purpose to improve the easy mixing property with colloidal silica, these particles can be surface treated particles, or can be used together with a dispersing agent.

In this invention, it is necessary that pH of the polishing compound fall within the region from 8.3 to 11.5. If it is lower than 8.3, the polishing speed becomes remarkably slow and is not suitable for practical use. If pH becomes higher than 11.5, the colloid of silica has a tendency to flocculate and hurt the stability of polishing compound and also is not suitable for practical use. Desirable upper limit of pH is 10.6. Further, pH of the polishing compound must not be easily altered by the considerable change of the external condition such as friction, heat, contact with atmosphere and mixing with other composition. The important point of the present invention is to make a polishing compound as a solution which has a strong buffering effect to maintain pH within narrow region against the change of the external condition. In the present invention, it is desirable that the logarithm of inverse number (pKa) of acid dissociation constant (Ka) at 25° C. of weak acid and/or weak base is within the limits of 8.0 to 12.5. When pKa at 25° C. is smaller than 8.0, large quantity of weak acid and/or weak base is needed to increase pH of the solution. And when pKa at 25° C. is larger than 12.5, it is difficult to prepare a buffer solution which has strong buffering effect to stabilize pH value within the limits of 8.3 to 11.5.

As an example of the weak acid to be used for the preparation of a polishing compound of this invention which has a buffering effect, boric acid (pKa=9.24), carbonic acid (pKa=10.33), phosphoric acid (pKa=12.35), water soluble organic acid, and mixture of these acids can be mentioned. As the weak base, water soluble amines and mixture of amines can be mentioned. Concretely, ethylenediamine (pKa=9.89), mono-ethanolamine (pKa=9.52), diethanol amine (pKa=8.90), triethylamine, ethylamine, diethylamine, 4-aminopyridine, piperazine (pKa=9.71), piperidine (pKa=11.1), butylenediamine, propylenediamine, butylamine, aminoethylpiperazine (pKa=9.11, 9.80), hydroxyethylpiperazine, and mixtures of these chemicals can be mentioned. In the case of weak acid and strong acid, if plural pKa values are existent, it can be used when one of these values is within the region of 8.0 to 12.5.

As the strong base, a hydroxide of alkali metal and water soluble quaternary ammonium compound can be mentioned. Further, as the strong acid, hydrochloric acid, nitric acid and sulfuric acid can be used.

To prepare the buffer solution, salts which are prepared by the combination of (1) weak acid and strong base, or (2) strong acid and weak base or (3) weak acid and weak base can be added, or, there can be added the combination of salts and base or salts and acid. The buffer solution of this invention, is the solution prepared by above mentioned combinations, in which weak acid and/or weak base is partially dissociated as an ion. That is, the dissociated state and undissociated state coexist in the solution. The pH of the solution does not alter largely by adding small amount of acid or base.

In the present invention, the polishing speed is remarkably improved by increasing the electric conductivity of polishing compound. And, in the present invention, electric conductivity is represented by electric conductivity per one unit length (microSiemens) converted to 1 wt. % of silicon oxide. As a method to increase the electric conductivity, the following two methods can be mentioned. That is, the first method is to make the concentration of buffer solution higher. The second method adds salts. The concentration of buffer solution can be made higher, by adding the combined solution of (1) weak acid and strong base, (2) strong acid and weak base or (3) weak acid and weak base without changing a molar ratio of acid and base. Salts which may be used in the second method of adding salts include a combination of acid and base. As acid, both strong acid and weak acid can be used, and mineral acid, organic acid and a mixture of them can be mentioned. As a base, both strong base and weak base can be used and concretely a hydroxide of alkali metal, water soluble quaternary ammonium compound and a mixture of them can be used. When the combined solution of weak acid and strong base, strong acid and weak base or weak acid and weak base is added, for the purpose of avoiding the change of pH of the polishing compound, it is not desirable to add large quantity of the solution. These two methods can be used together.

To improve the physical property of the polishing compound of this invention, surfactant, dispersing agent or anti-sedimentation agent can be used together with the buffering combination. As a surfactant, a dispersing agent and an anti-sedimentation agent, water soluble organic composition or inorganic layered compound can be mentioned. Further, although the polishing compound of this invention is an aqueous solution, it is possible to add organic solvent. The polishing compound of this invention can be conveniently prepared by mixing colloidal silica, base, additives and water. The fine particles of metal compound can be added after being dispersed in water or they may be ground in wet condition by a ball mill so as to make the productivity better. As a dispersing agent, anionic surfactant, cationic surfactant or nonionic surfactant can be used. The pH value of the solution of colloidal silica and the slurry of metal oxide, metal nitride or metal carbide to be used can be adjusted within the region of 9.0 to 12.0 before mixing.

Alternatively, a concentrated polishing compound having 15 to 65% solids content may be prepared and, prior to use, the concentrate is diluted by adding water or a mixture of water and organic solvent.

The polishing compound and the polishing method using the polishing compound of this invention will be understood more readily with reference to the following Examples and Comparative Examples, however these Examples are only intended to illustrate the invention and should not be construed to limit the scope of the invention.

The polishing compound used in the Examples and the Comparative Examples are prepared by the following procedure.

As the colloidal silica, the product of 15 nanometer average diameter and 30 wt. % concentration which is on market is used. To the prescribed quantity of colloidal silica, 100 g of DI water is added then at least one kind of metal compound particles having 20 to 2000 nanometers average diameter selected from metal oxide, metal nitride and metal carbide, and acid, base and salts are added with constant stirring. The dispersion is adjusted to 3000 g by adding DI water, thus the solution of polishing compound to be used in the Examples is prepared. The silicon oxide concentration of this solution is 5 wt. %.

Polishing condition used in the examples is illustrated as follows.

Polishing machine: EP-200-V type (product of Speedfam Co., Ltd.)
Rotating speed of drum: 1800 RPM
Traverse speed of drum: 1 mm/min
Polishing pad: SUBA400 (product of Rodel•Nitta Co., Ltd.)
Flow rate of polishing compound: 600 mL/min
Polishing time: 5 minutes
Work-piece: 8 inch diameter silicon wafer with silicon oxide layer.

The polishing speed is calculated from the difference of work-piece weight before polishing and after polishing. The pH of the polishing compound is measured by a pH meter which is adjusted by pH standard solutions of 6.86 and 9.18. Electric conductivity is measured by an electric conductivity meter. The roughness of polished edge surface is measured by Surfcom Profile M2000 (product of Chapman Instruments Co., Ltd.).

EXAMPLES AND COMPARATIVE EXAMPLES

Experiment numbers 1 to 18 of Table 1-1 and Table 1-2 are Examples of this invention. In these Examples, each polishing compound is prepared by adding particles of metal compound and other additives to the colloidal solution containing fine particles of silicon oxide according to the mixing ratio indicated in the Tables. Experiment numbers 19 to 23 in Table 2 are polishing compounds of Comparative Examples. The edge polishing experiments using these polishing compounds are carried out on a work-piece of 8 inch diameter silicon wafer with low-temperature oxide layer. The obtained results are summarized in Table 1-1, Table 1-2 and Table 2.

As clearly understood from the results in Tables, the polishing compounds of this invention have an excellent polishing ability on the edge polishing of silicon wafer whose surface is covered by the oxide layer and the obtained surface roughness is good.

TABLE 1-1

| | | | Examples | | | | | | | |
|---|---|---|---|---|---|---|---|---|---|---|
| Experiment No. | | | 1 | 2 | 3 | 4 | 5 | 6 | 7 | 8 |
| Abrasive | SiO$_2$ | % | 5 | 5 | 5 | 5 | 5 | 5 | 5 | 5 |
| | ZrO$_2$ | nm* | 50 | 50 | 50 | 50 | 50 | 50 | 50 | 50 |
| | | % | 0.5 | 1.0 | 1.0 | 1.0 | 0.5 | 0.5 | 1.0 | 1.0 |
| | CeO$_2$ | nm | | | | | | | | |
| | | % | | | | | | | | |
| | Al$_2$O$_3$ | nm | | | | | 300 | 300 | 300 | |
| | | % | | | | | 0.5 | 0.5 | 1.0 | |
| Additive (mol/Kg-SiO$_2$) | TMAOH** | | 0.288 | 0.288 | | 0.288 | 0.144 | 0.288 | 0.288 | |
| | EG | | | | | | | | | 0.2 |
| | K$_2$CO$_3$ | | | | 0.288 | | | | | 0.144 |
| | KHCO$_3$ | | 0.289 | 0.289 | | 0.291 | 0.145 | 0.289 | 0.280 | |
| | K$_2$SO$_4$ | | | | | | | | | 0.144 |
| pH | | | 10.4 | 10.4 | 10.4 | 10.4 | 10.4 | 10.4 | 10.4 | 10.4 |
| Electric conductivity*** | | | 71 | 63 | 65 | 60 | 42 | 71 | 66 | 100 |
| polishing speed mg/m | | | 11.0 | 13.6 | 10.5 | 22.0 | 9.9 | 13.1 | 16.6 | 12.0 |
| surface roughness nanometer | | | 19 | 16 | 18 | 2.0 | 20 | 15 | 8.0 | 13 |

*nanometer
**tetramethyl-ammoniumhydroxide
***micro.Siemens/m/1%-SiO$_2$

TABLE 1-2

| | | | Examples | | | | | | | | | |
|---|---|---|---|---|---|---|---|---|---|---|---|---|
| Experiment No. | | | 9 | 10 | 11 | 12 | 13 | 14 | 15 | 16 | 17 | 18 |
| Abrasive | SiO$_2$ | % | 5 | 5 | 5 | 5 | 5 | 10 | 10 | 10 | 5 | 5 |
| | ZrO$_2$ | nm* | | | | | | 50 | 50 | 50 | 50 | 50 |
| | | % | | | | | | 1.0 | 0.5 | 0.5 | 1.0 | 1.0 |
| | CeO$_2$ | nm | 600 | 600 | 600 | 600 | 600 | 600 | 600 | 600 | 600 | 600 |
| | | % | 0.2 | 0.5 | 0.7 | 1.0 | 1.0 | 0.5 | 1.0 | 1.5 | 1.0 | 1.0 |
| | Al$_2$O$_3$ | nm | | | | | | | | | 300 | 300 |
| | | % | | | | | | | | | 1.0 | 1.0 |
| Additive (mol/Kg- | TMAOH** | | 0.288 | 0.288 | 0.288 | 0.288 | | 0.288 | 0.288 | 0.288 | 0.288 | |
| | K$_2$CO$_3$ | | | | | | 0.288 | | | | | 0.288 |

TABLE 1-2-continued

| | | Examples | | | | | | | | |
|---|---|---|---|---|---|---|---|---|---|---|
| Experiment No. | | 9 | 10 | 11 | 12 | 13 | 14 | 15 | 16 | 17 | 18 |
| $SiO_2$) KHCO$_3$ | | 0.291 | 0.291 | 0.291 | 0.291 | | 0.291 | 0.291 | 0.291 | 0.291 | |
| K$_2$SO$_4$ | | | | | | 0.144 | | | | | |
| pH | | 10.4 | 10.4 | 10.4 | 10.4 | 10.4 | 10.4 | 10.4 | 10.4 | 10.4 | 10.4 |
| Electric conductivity*** | | 72 | 72 | 71 | 70 | 100 | 72 | 71 | 71 | 70 | 65 |
| polishing speed mg/m | | 9.0 | 12.6 | 15.1 | 18.2 | 16.4 | 12.0 | 18.8 | 15.1 | 18.2 | 16.4 |
| surface roughness nanometer | | 19 | 14 | 10 | 5.4 | 7.5 | 19 | 5.2 | 8.0 | 5.2 | 6.2 |

TABLE 2

| | | | Comparative Examples | | | | |
|---|---|---|---|---|---|---|---|
| Experiment No. | | | 19 | 20 | 21 | 22 | 23 |
| Abrasive | SiO$_2$ | % | 5 | 10 | 5 | 5 | 5 |
| | ZrO$_2$ | nm* | | | 50 | | |
| | | % | | | 0.05 | | |
| | CeO$_2$ | nm | | | | | |
| | Al$_2$O$_3$ | nm | | | | | |
| Additive (mol/Kg-SiO$_2$) | TMAOH** | | | | | 0.144 | |
| | K$_2$CO$_3$ | | | | | | 0.288 |
| | MEA | | 0.16 | 0.16 | 0.16 | | |
| | K$_2$SO$_4$ | | | | | | |
| pH | | | 10.5 | 10.7 | 10.4 | 10.4 | 10.4 |
| Electric conductivity*** | | | 10 | 11 | 10 | 42 | 66 |
| polishing speed mg/m | | | 4.5 | 6.5 | 5.1 | 6.9 | 6.1 |
| surface roughness nanometer | | | 52 | 50 | 48 | 44 | 49 |

Effect of the Invention

As illustrated above, the polishing compound of this invention contains silicon oxide particles of 8 to 500 nanometers average diameter, at least one kind of metal compound particles having 20 to 2000 nanometers average diameter selected from the group composed by metal oxide, metal nitride and metal carbide, and acid and base forming a buffering solution for maintaining pH between pH 8.3 to 11.5, and the silica concentration at the actual use is adjusted to 1 to 15 wt. %. By making the polishing compound itself a buffering solution and by making the electric conductivity larger, the polishing compound whose pH change is small and has high polishing speed can be obtained. With the polishing compound of this invention, an edge of silicon wafer covered by oxide or nitride layer and a wafer of device substrate of semiconductor can be polished constantly at high speed without deteriorating the surface quality.

What is claimed is:

1. A polishing compound comprising a dispersion containing particles of silicon oxide, said particles having average diameter of 8 to 500 nanometers and particles of at least one kind of metal compound, said particles of said at least one kind of metal compound having an average diameter of 10 to 3000 nanometers and being selected from the group consisting of metal oxide other than silicon oxide, metal nitride and metal carbide, wherein the silicon oxide particles are contained in the dispersion at a concentration of from 1 to 15 wt. %, said metal compound particles being contained in the dispersion at a concentration of from 0.1 to 10 wt. %, and said dispersion further comprising a pH buffer combination selected from the group consisting of weak acid and strong base, strong acid and weak base, and weak acid and weak base, wherein the logarithms of reciprocal number of acid dissociation constant at 25° C. of said weak acid and/or weak base is in the range of from 8.0 to 12.5, whereby said buffer combination maintains said dispersion at a pH in the range of from 8.3 to 11.5.

2. The polishing compound of claim 1, wherein the dispersion has an electronic conductivity at 25° C. which is bigger than 25 mS/m per 1 wt. % of silicon oxide.

3. A polishing compound concentrate comprising a dispersion containing from 15 to 65 wt % of particles of silicon oxide having an average particle diameter of from 8 to 500 nanometers and particles of metal compound, other than silicon oxide, and selected from the group consisting of metal oxide, metal nitride, metal carbide, and mixtures thereof, said particles of metal compound having an average particle diameter in the range of 10 to 3000 nanometers, whereby, upon diluting the concentrate with liquid, selected from the group consisting of water, organic solvent and mixture thereof, at least one of said concentrate or said liquid further comprising salts, base, buffer solution or mixture thereof, will provide a polishing compound comprising a dispersion of from 1 to 15 wt % of said silicon oxide particles and from 1 to 10 wt. % of said particles of metal compound, a pH buffer combination selected from the group consisting of weak acid and strong base, strong acid and weak base, and weak acid and weak base, wherein the logarithms of reciprocal number of acid dissociation constant at 25° C. of said weak acid and/or weak base is in the range of from 8.0 to 12.5, whereby the pH of said dispersion will be maintained at a pH in the range of from 8.3 to 11.5.

4. A method for polishing the edge of a silicon wafer whose surface comprises a coating of an oxidized layer or nitride layer, using a rotating drum of an edge polishing machine, said rotating drum having a polisher covering the surface thereof, said method comprising pressing the coated edge of said silicon wafer against the polisher on the surface of said rotating drum while rotating the drum, and while supplying the polishing compound of claim 1, to the polisher, whereby chemical and mechanical polishing of said oxidized layer or nitride layer is effected by said polishing compound.

5. The polishing compound of claim 1, comprising from 1 to 10 wt % of said particles of silicon dioxide.

6. The polishing compound of claim 1, wherein the particles of said at least one metal compound comprise particles of at least one of aluminum oxide, zirconium oxide, cerium oxide, manganese oxide, boron nitride, silicon nitride or silicon carbide.

7. The polishing compound of claim 6, wherein the particles of said at least one metal compound have an average diameter of from 20 to 1000 nanometers.

8. The polishing compound of claim 6, wherein the particles of said at least one metal compound have an average diameter of from 20 to 400 nanometers.

9. The polishing compound of claim 1, wherein said dispersion has a pH of from 8.3 to 10.6.

10. The polishing compound of claim 1, wherein the buffer combination comprises a weak acid and a strong base.

11. The polishing compound of claim 1, wherein the buffer combination comprises a strong acid and a weak base.

12. The polishing compound of claim 1, wherein the buffer combination comprises a weak acid and a weak base.

13. The polishing compound of claim 1, wherein the buffer combination maintains the pH of the dispersion at below about 10.6.

14. The polishing compound of claim 1, wherein the buffer combination maintains the pH of the dispersion in the range of from about 10.2 to about 10.4.

15. The polishing compound of claim 1, wherein the concentration of the silicon oxide fine particles is in the range of from 1 to 10% by weight.

* * * * *

UNITED STATES PATENT AND TRADEMARK OFFICE
CERTIFICATE OF CORRECTION

PATENT NO. : 6,312,487 B1  
DATED : November 6, 2001  
INVENTOR(S) : Hiroaki Tanaka Page 1 of 1

It is certified that error appears in the above-identified patent and that said Letters Patent is hereby corrected as shown below:

<u>Title page,</u>  
Item [73], Assignee, should read as follows:  
-- Speedfam Co. Ltd., Kanagawa-pref (JP) --

Signed and Sealed this

Seventh Day of May 2002

Attest:

Attesting Officer

JAMES E. ROGAN  
*Director of the United States Patent and Trademark Office*